(12) United States Patent
Arai et al.

(10) Patent No.: US 11,653,482 B2
(45) Date of Patent: May 16, 2023

(54) ELECTRONIC COMPONENT

(71) Applicant: FUTABA CORPORATION, Mobara (JP)

(72) Inventors: Tomohiro Arai, Mobara (JP); Yusuke Ii, Mobara (JP); Hiroyuki Tsuchiya, Mobara (JP)

(73) Assignee: FUTABA CORPORATION, Mobara (JP)

( * ) Notice: Subject to any disclaimer, the term of this patent is extended or adjusted under 35 U.S.C. 154(b) by 17 days.

(21) Appl. No.: 17/338,730

(22) Filed: Jun. 4, 2021

(65) Prior Publication Data

US 2021/0410342 A1    Dec. 30, 2021

(30) Foreign Application Priority Data

Jun. 26, 2020 (JP) .............................. JP2020-110390

(51) Int. Cl.
*H05K 5/02* (2006.01)
*H05K 9/00* (2006.01)
*H02K 5/22* (2006.01)

(52) U.S. Cl.
CPC ............. *H05K 9/0067* (2013.01); *H02K 5/22* (2013.01); *H05K 5/02* (2013.01); *H05K 9/0079* (2013.01)

(58) Field of Classification Search
CPC ........... H05F 3/00; H05F 3/02; H05K 1/0218; H05K 9/0079; H05K 9/0039; H05K 9/0067; H02K 11/40
USPC .................................................. 361/212, 220
See application file for complete search history.

(56) References Cited

U.S. PATENT DOCUMENTS

| 2013/0170159 A1 | 7/2013 | Jiang |
| 2016/0248292 A1 | 8/2016 | Takarai |
| 2019/0051875 A1* | 2/2019 | Choi ...................... H01M 50/20 |
| 2019/0227538 A1* | 7/2019 | Lassini ................. B64C 39/024 |
| 2021/0211024 A1 | 7/2021 | Pyeon |

FOREIGN PATENT DOCUMENTS

| CN | 206727915 U | 12/2017 |
| DE | 102016202463 A1 | 8/2016 |
| KR | 10-2017-0082911 A | 7/2017 |
| TW | 201826670 A | 7/2018 |

OTHER PUBLICATIONS

Office Action dated Mar. 2, 2022 issued in corresponding German application No. 10 2021 116 437.0.
Korean Office Action issued in counterpart Korean Patent Appln. No. 10-2021-0082594 dated Jan. 16, 2023.

* cited by examiner

*Primary Examiner* — Danny Nguyen
(74) *Attorney, Agent, or Firm* — Bacon & Thomas, PLLC

(57) ABSTRACT

An electronic component includes a case body, an electronic circuit, and a conductor portion. The case body is formed by fitting a first housing and a second housing. The electronic circuit board is accommodated in the case body. The conductor portion is formed to continuously extend in a circumferential direction of the electronic circuit board at a portion of the first housing where the first housing is fitted to the second housing. The conductor portion is electrically connected to a ground of the electronic circuit board.

4 Claims, 5 Drawing Sheets

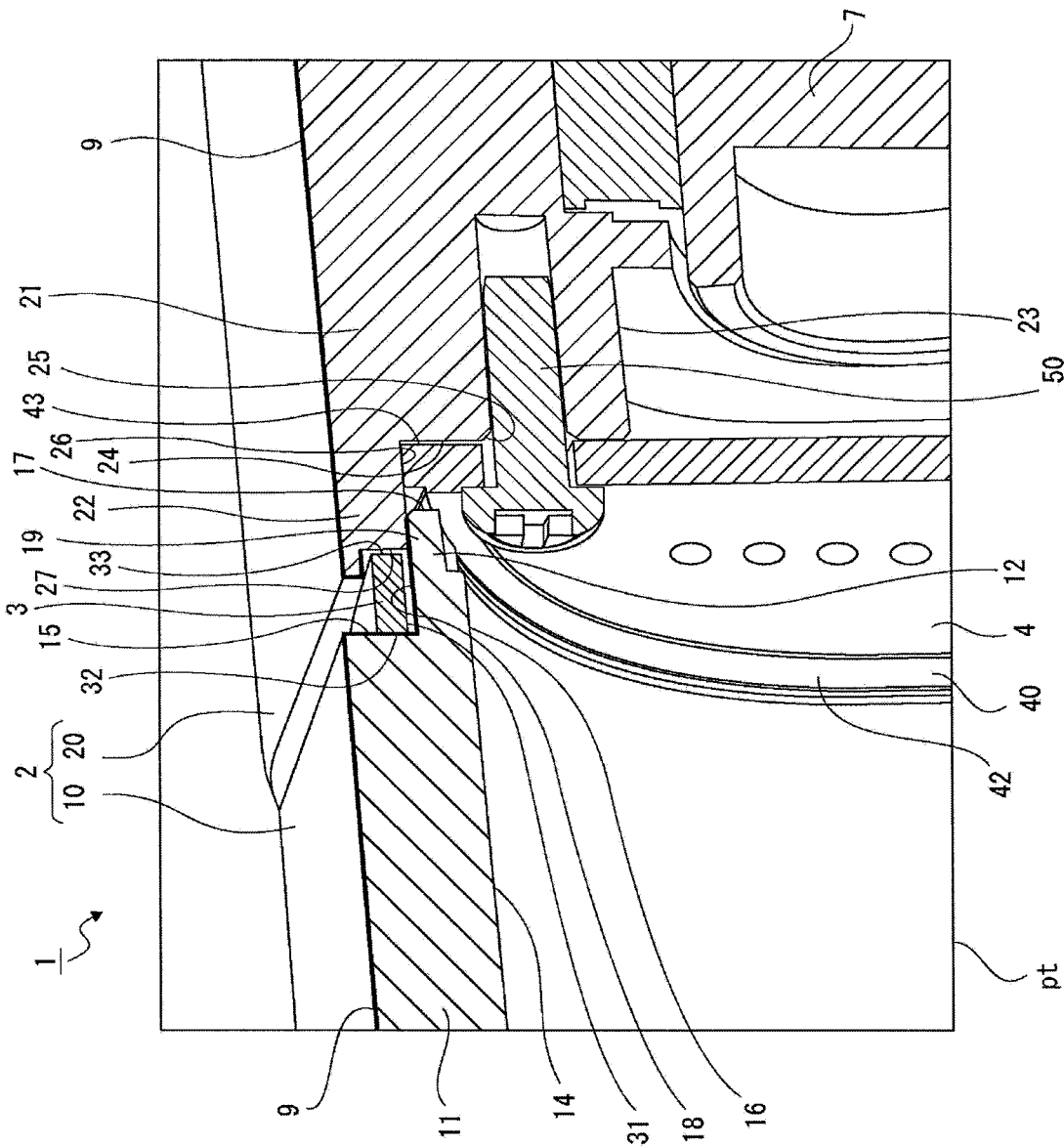

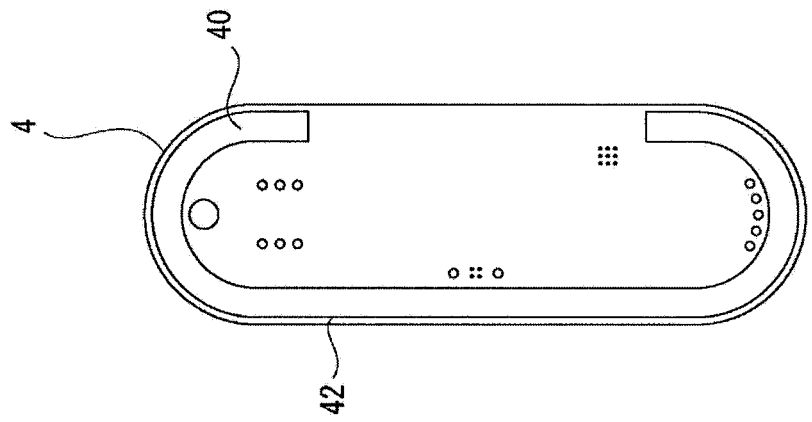
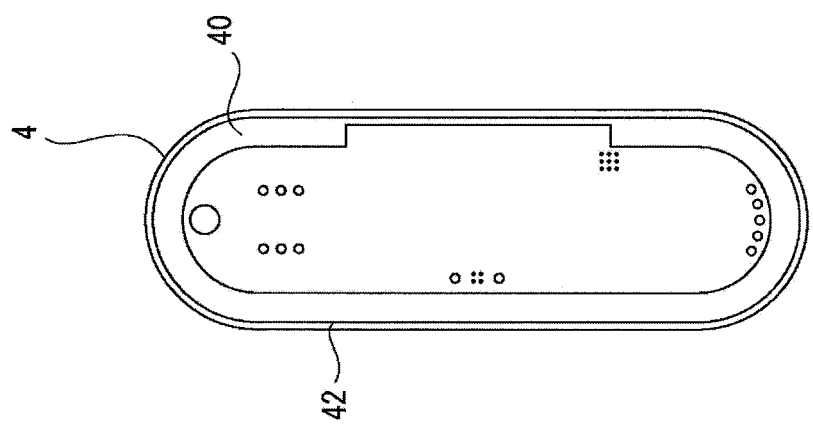
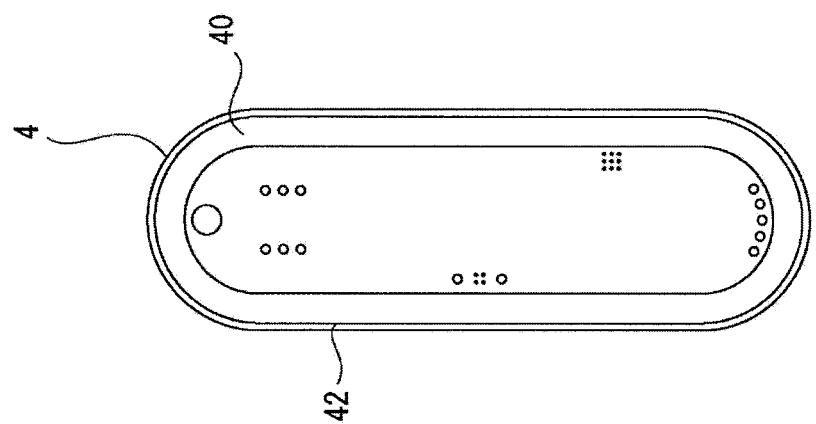

ELECTRONIC COMPONENT

TECHNICAL FIELD

The present disclosure relates to a structure of an electronic component.

BACKGROUND

For example, Japanese Patent Application Publication No. 2007-5265 discloses, as an example of an electronic component, a servo motor device having therein a control circuit board and formed by fitting a first housing and a second housing.

In such an electronic component formed by fitting multiple housings, static electricity may enter the electronic component through a slight gap between the housings when the static electricity is applied from the outside to the electronic component. In this case, a high voltage is applied to a component on an electronic circuit board, so that the corresponding component may be damaged.

Therefore, there is a demand for a structure for releasing the static electricity that has entered through the gap between the housings to the ground.

SUMMARY

The present disclosure provides a structure of an electronic component that prevents static electricity from entering an electronic circuit board built in the electronic component.

In accordance with an aspect of the present disclosure, there is provided an electronic component including: a case body that is formed by fitting a first housing and a second housing; an electronic circuit board that is accommodated in the case body; a conductor portion that is formed to continuously extend in a circumferential direction of the electronic circuit board at a portion of the first housing where the first housing is fitted to the second housing. Further, the conductor portion is electrically connected to a ground of the electronic circuit board.

Static electricity may enter through a portion where the first housing and the second housing are in contact with each other. Therefore, the conductor portion that is formed to continuously extend in the circumferential direction is formed at the fitting portion between the first housing and the second housing.

In the electronic component described above, each of the first housing and the second housing may be made of a conductive material on a surface of which an insulating film is formed, the conductive material may be electrically connected to the ground, and the conductor material of the conductor portion of the first housing may be exposed.

Since each of the first housing and the second housing is made of the conductive material, a shielding effect against electromagnetic waves is obtained. Further, by forming the insulating film on each of the first housing and the second housing, it is possible to prevent short circuit from occurring in the case body. Moreover, by forming the insulating film 9, the corrosion of the case body made of the conductive material is prevented.

In that case, since the insulating film is not formed on the conductor portion of the first housing, the static electricity entering from the fitting portion between the first housing and the second housing flows into the ground through the conductor portion.

In the electronic component described above, a ground line may be formed in a substantially circumferentially wound shape on the electronic circuit board.

For example, the ground line may be formed to continuously extend or partially extend in a circumferential direction on a peripheral edge portion of the electronic circuit board. However, the ground line is mostly formed in a substantially circumferentially wound shape.

In the electronic component described above, the electronic component may be a servo motor device.

For example, the structure of the electronic device of the present disclosure is adopted for a servo motor used for an unmanned aerial vehicle (UAV).

According to the aspect of the present disclosure, it is possible to prevent static electricity from entering an electronic circuit board.

BRIEF DESCRIPTION OF THE DRAWINGS

The objects and features of the present disclosure will become apparent from the following description of embodiments, given in conjunction with the accompanying drawings, in which:

FIG. 4 is a partially enlarged cross-sectional view of the servo motor device according to the embodiment when viewed from the X-X direction shown in FIG. 1; and FIGS. 5A to 5C show examples of arrangement of a ground line on an electronic circuit board according to the embodiment.

DETAILED DESCRIPTION

Figure 1:
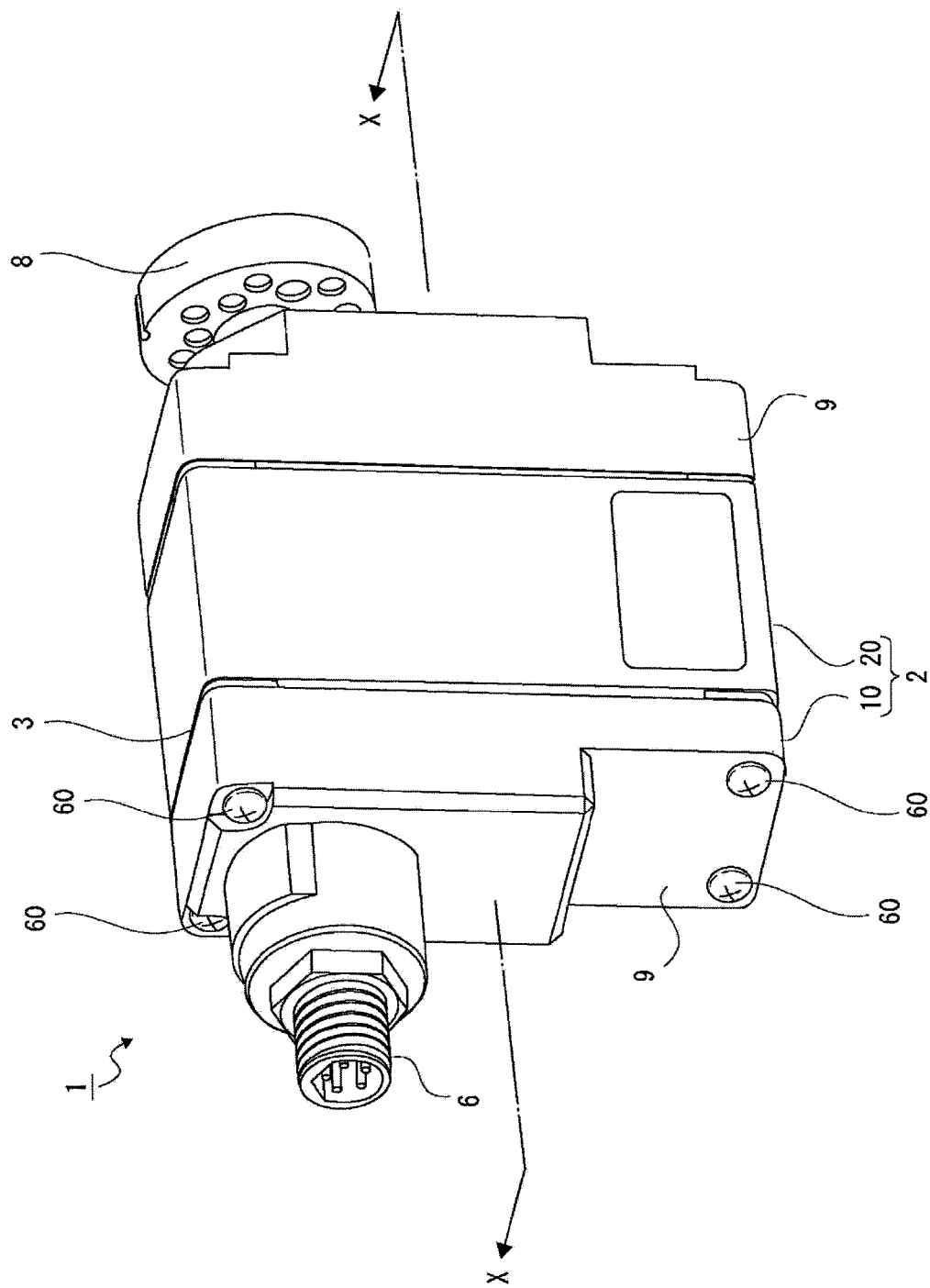
FIG. 1 shows an external appearance of a servo motor device according to an embodiment of the present disclosure.

Hereinafter, embodiments of the present invention will be described.

In the present embodiment, a servo motor device 1 will be described as an example of an electronic component according to the embodiment of the present disclosure with reference to FIGS. 1 to 5. The servo motor device 1 is, for example, a servo motor for an unmanned aerial vehicle (UAV).

The electronic component according to the embodiment of the present disclosure is not limited to the servo motor device 1 and may be any device as long as static electricity may enter the electronic circuit board through a gap between members forming the electronic component.

Further, the servo motor device 1 is not limited to the servo motor for a UAV and may be any servo device for driving an object to be controlled based on an inputted control signal. The servo motor device 1 is a servo device suitable for remote control of an industrial radio-controlled model, a radio-controlled model, a robot, or the like based on a control signal transmitted by radio waves, a computer, or a programmable logic controller (PLC).

The configurations illustrated in the drawings referred to in the description of the present embodiment are the extracted configurations of the main parts and the neighboring configurations of the main parts that are required to realize the present embodiment. Further, the drawings are schematic, and the relationship between the thickness and the plane dimension of each component illustrated in the drawings and the ratio thereof are merely examples. Therefore, various changes can be made depending on the design or the like without departing from the technical idea of the present disclosure.

First, a configuration example of the servo motor device 1 of the present embodiment will be described with reference to FIGS. 1 to 5.

Figure 2:
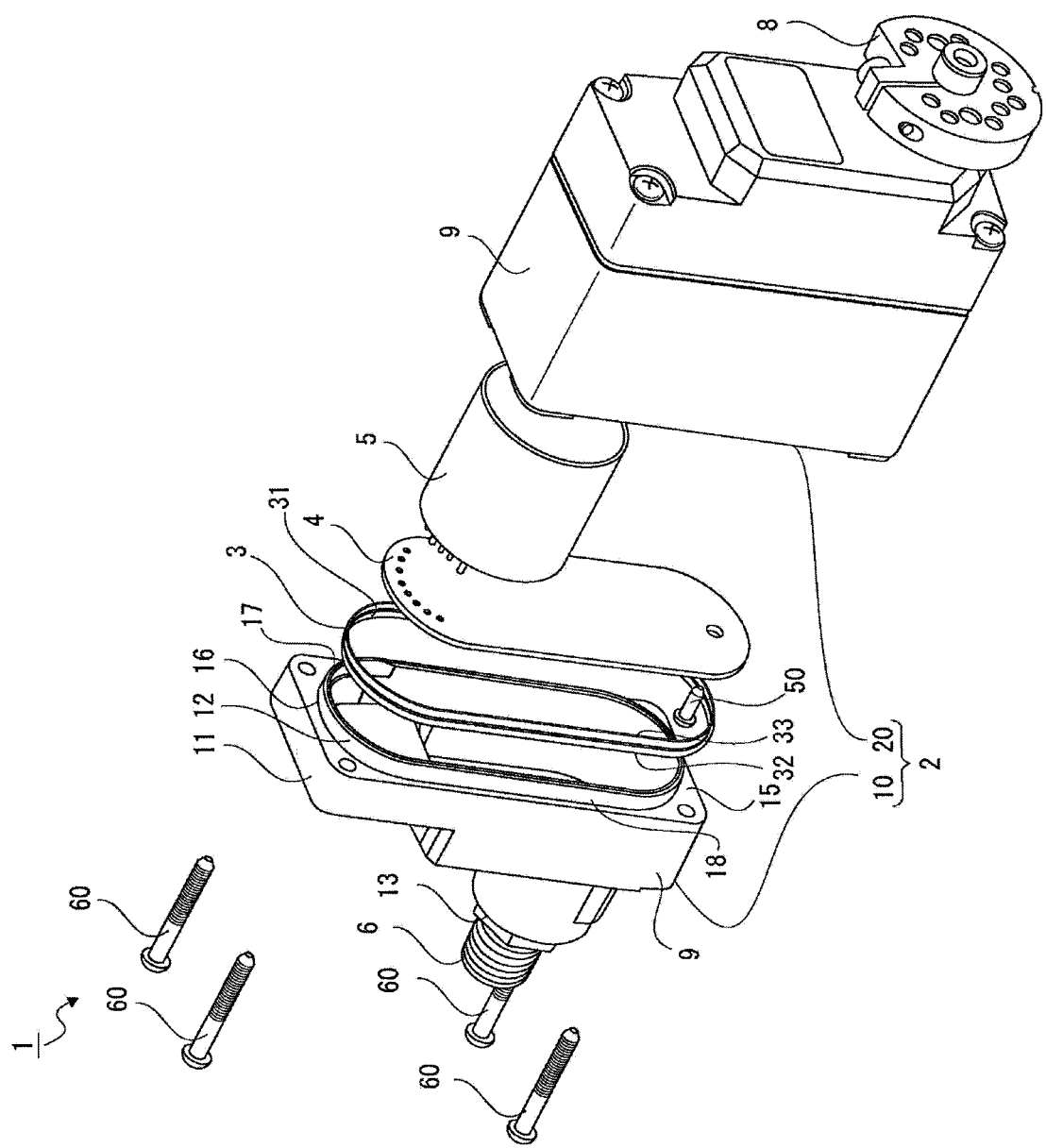
FIG. 2 is an exploded perspective view of the servo motor device according to the embodiment.
Figure 3:
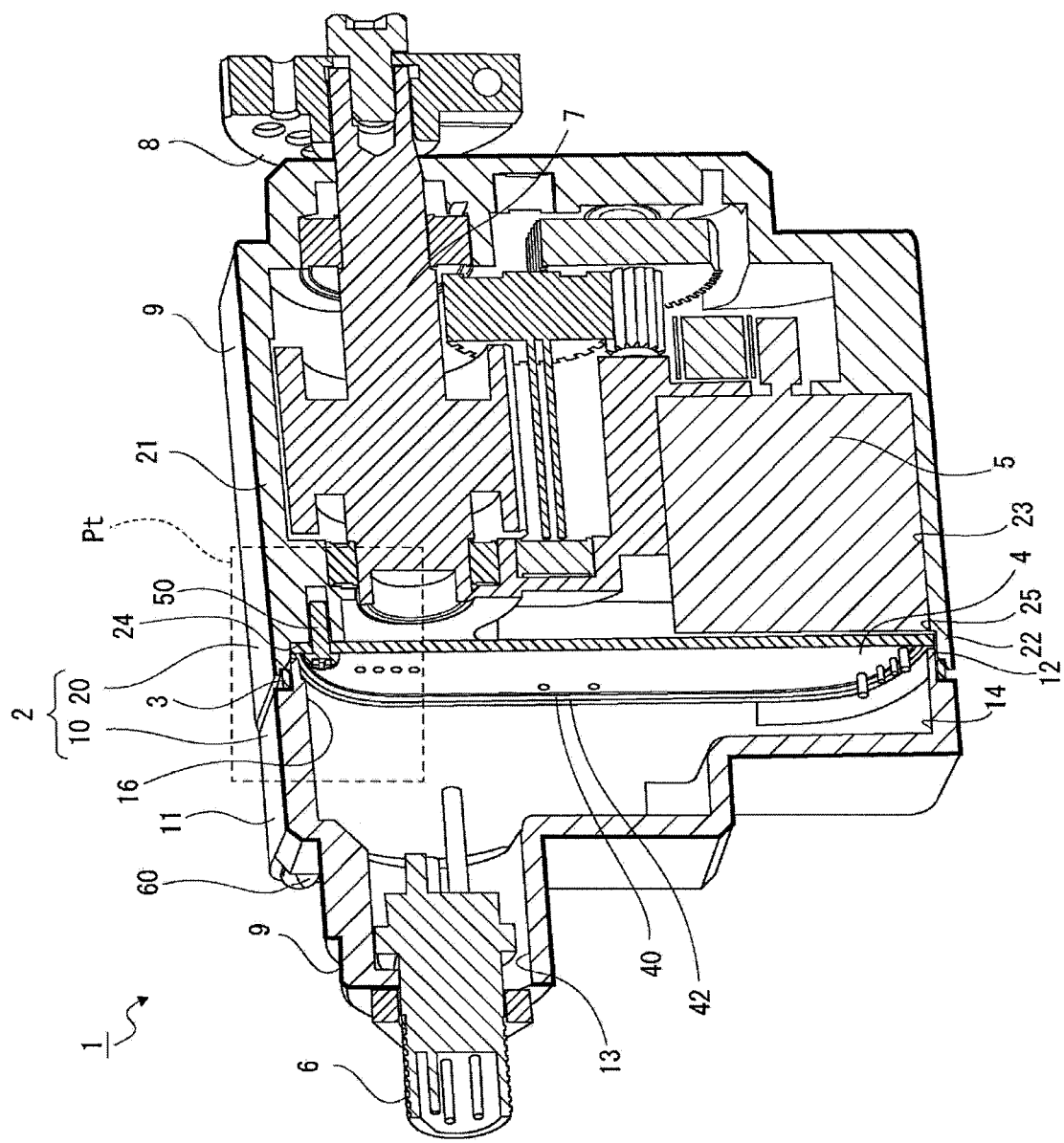
FIG. 3 is a cross-sectional view of the servo motor device according to the embodiment when viewed from a X-X direction shown in FIG. 1.

FIG. 1 shows an external appearance of the servo motor device 1. FIG. 2 is an exploded perspective view of the servo motor device 1. FIG. 3 is a cross-sectional view of the servo motor device when viewed from a X-X direction shown in FIG. 1. FIG. 4 is an enlarged view of a region Pt shown in FIG. 3. FIGS. 5A to 5C show examples of an arrangement of a ground line 40 on an electronic circuit board 4.

Various members constituting the servo motor device 1 in the present embodiment will be described. The servo motor device 1 includes a case body 2, an attaching ring 3, an electronic circuit board 4, a motor unit 5, a connector 6, a driving mechanism 7, and a driving unit 8 (see FIGS. 1 to 3). The case body 2 is formed by fitting a first housing 10 and a second housing 20.

In the following description, a forward-backward direction is defined by setting a direction from the second housing 20 side to the first housing 10 side as a forward direction and a direction from the first housing 10 side to the second housing 20 as a backward direction in the servo motor device 1 shown in FIG. 1.

The first housing 10 and the second housing 20 are made of a conductive material, for example, aluminum or the like. An insulating film 9 is formed on surfaces of the first housing 10 and the second housing 20, except a surface of a conductor portion 17 of the first housing 10, which will be described later, by corrosion-resistant treatment such as anodizing treatment.

The first housing 10 includes a first body 11 and a first fitting protrusion 12 (see FIGS. 2 and 3). The connector 6 for inputting a voltage for operating the servo motor device 1 from a power source is connected to an attaching hole 13 formed on the front side of the first body 11.

A first receiving hole 14 that is opened rearward is formed at the first body 11. The first receiving hole 14 has a first opening 16 that is formed on a rear surface 15 of the first body 11. The first fitting protrusion 12 protrudes rearward from an opening edge of the first opening 16.

The rear end surface of the first fitting protrusion 12 is formed to serve as the conductor portion 17 (see FIG. 4). The conductor portion 17 is formed with the insulating film 9 being peeled off therefrom as described above. The conductor portion 17 is formed to continuously extend in a circumferential direction. The conductor portion 17 may be formed on the entire rear end surface of the first fitting protrusion 12 or may be formed at a part of the rear end surface of the first fitting protrusion 12.

The second housing 20 includes a second body 21 and a second fitting protrusion 22 (see FIGS. 3 and 4).

A second receiving hole 23 that is opened forward is formed at the second body 21. The second receiving hole 23 has a second opening 25 that is formed on a front surface 24 of the second body 21. The second fitting protrusion 22 protrudes forward from an outer peripheral end of the front surface 24 of the second body 21.

The attaching ring 3 is formed in an annular shape so that an inner circumferential surface 31 of the attaching ring 3 comes into contact with an outer circumferential surface 18 of the first fitting protrusion 12 (see FIGS. 2 and 4).

The electronic circuit board 4 installs thereon various components constituting an electronic circuit. On a front surface of the electronic circuit board 4, a ground line 40 is formed as a conductor pattern. The ground line 40 is formed to extend in a circumferential direction (a substantially circumferentially wound shape) on an outer peripheral portion 42 of the front surface of the electronic circuit board 4 (see FIGS. 3 to 5).

The ground line 40 has various shapes depending on an arrangement design of the components on the electronic circuit board 4. The following are examples of the arrangement of the ground line 40 formed in the substantially circumferentially wound shape on the outer peripheral portion 42 of the front surface of the electronic circuit board 4.

For example, the ground line 40 may be formed to continuously extend in the circumferential direction on the outer peripheral portion 42 (see FIG. 5A). As an alternative example, the ground line 40 may be formed to continuously extend in the circumferential direction on the outer peripheral portion 42, with a width thereof partially reduced in certain portions of the ground line 40 depending on the arrangement design of the components on the electronic circuit board 4 (see FIG. 5B). As another alternative example, the ground line 40 may not be formed on a part of the outer peripheral portion 42 while extending in the circumferential direction depending on the arrangement design of the components on the electronic circuit board 4 (see FIG. 5C).

The first housing 10 and the second housing 20 that are made of a conductive material are electrically connected to the ground line 40. Accordingly, static electricity flowing into the conductor portion 17 of the first housing 10 from which the insulating film 9 is peeled off flows into the ground formed by the first housing 10, the second housing 20, and the ground line 40.

The motor unit 5 is connected to a rear side of the electronic circuit board 4. The electronic circuit board 4 controls the motor unit 5. The motor unit 5 is connected to the driving mechanism 7, and the driving unit 8 is driven via the driving mechanism 7 by transmitting an output torque of the motor unit 5 to the driving mechanism 7.

Next, an example of installing various members constituting the servo motor device 1 in the present embodiment will be described.

The driving mechanism 7 and the motor unit 5 connected to the electronic circuit board 4 are accommodated in the second receiving hole 23 of the second housing 20 (see FIGS. 2 and 3).

The front surface 24 of the second body 21 comes into contact with an outer peripheral portion 43 of the rear surface of the electronic circuit board 4 (see FIG. 4). The electronic circuit board 4 and the second body 21 in contact with each other are fixed by means of, for example, screws 50.

Further, by bringing the inner circumferential surface 31 of the attaching ring 3 into contact with the outer circumferential surface 18 of the first fitting protrusion 12 of the first housing 10, the attaching ring 3 is attached to the first housing 10.

In a state where the attaching ring 3 is attached to the first housing 10, a rear outer circumferential surface 19 of the first fitting protrusion 12 is brought into contact with an inner circumferential surface 26 of the second fitting protrusion 22. Thus, the first housing 10 is fitted to the second housing 20.

Accordingly, the static electricity, which has entered the gap between the rear outer circumferential surface 19 of the first fitting protrusion 12 and the inner circumferential surface 26 of the second fitting protrusion 22, flows into the conductor portion 17 before it reaches the electronic circuit board 4. As a result, the static electricity flows into the ground formed by the first housing 10, the second housing 20, and the ground line 40.

A front end surface 32 of the attaching ring 3 is brought into contact with the rear surface 15 of the first housing 10 and a rear end surface 33 of the attaching ring 3 is brought into contact with a front end surface 27 of the second fitting protrusion 22, so that the positions of the attaching ring 3, the first housing 10, and the second housing 20 are aligned.

At this time, the conductor portion 17 of the first housing 10 is disposed to face the electronic circuit board 4. Further, the conductor portion 17 may be in direct contact with the ground line 40 of the electronic circuit board 4. In the case where the conductor portion 17 being in direct contact with the ground line 40, the electronic circuit board 4 may be subjected to surface treatment such as leveling or the like to prevent the conductivity of the ground line 40 from deteriorating due to oxidation.

In a state where the positions of the attaching ring 3, the first housing 10, and the second housing 20 are aligned, the first housing 10 and the second housing 20 are fixed by means of, for example, a plurality of screws 60 (See FIGS. 1 and 2).

As described above, in the servo motor device 1 (electronic component) of the present embodiment, the first housing 10 and the second housing 20 are fitted to form the case body 2; the electronic circuit board 4 is accommodated in the case body 2; the conductor portion 17 is formed to continuously extend in a circumferential direction at the portion of the first housing 10 that is fitted to the second housing 20; and the conductor portion 17 is electrically connected to the ground of the electronic circuit board 4 (see FIGS. 1 to 5).

Static electricity may enter through the portion where the first housing 10 and the second housing 20 are in contact with each other. Therefore, the conductor portion 17 that is formed to continuously extend in the circumferential direction is formed at the fitting portion between the first housing 10 and the second housing 20.

Accordingly, the static electricity entering from the fitting portion is made to flow from the conductor portion to the ground. As a result, it is possible to effectively block the inflow of the static electricity into the electronic circuit board 4.

In the servo motor device 1 of the present embodiment, the first housing 10 and the second housing 20 are made of a conductive material on a surface of which the insulating film 9 is formed; the conductive material is electrically connected to the ground; and the conductive material of the conductor portion 17 of the first housing 10 is exposed (see FIGS. 1 to 5).

Since each of the first housing 10 and the second housing 20 is made of a conductive material, a shielding effect against electromagnetic waves is obtained. Further, by forming the insulating film 9 on each of the first housing 10 and the second housing 20, it is possible to prevent short circuit from occurring in the case body 2. Further, by forming the insulating film 9, the corrosion of the case body 2 made of the conductive material is prevented.

In this case, the conductive material of the conductor portion 17 of the first housing 10 is exposed, so that the static electricity entering from the fitting portion between the first housing 10 and the second housing 20 flows from the conductor portion 17 to the ground.

For example, when the case body 2 is an aluminum case, the shielding effect against electromagnetic waves is obtained. Further, by forming the insulating film 9 on the case body 2, it is possible to obtain the effect of preventing short circuit from occurring in the case body 2 and an effect of preventing corrosion, which is particularly suitable for an equipment for an outdoor UAV.

Further, as an example of a method of exposing the conductive material of the conductor portion 17 of the first housing 10, a method of forming the insulating film 9 on the first housing 10 except for the conductor portion 17 or a method of forming the insulating film 9 on the first housing and then peeling off the insulating film 9 of the conductor portion 17 can be considered.

Especially in the latter case, since the insulating film 9 is peeled off later, the conductor portion 17 can be formed by simple processing and the manufacturing efficiency can be improved.

Further, since the conductor portion 17 is a part of the conductive material forming the case body 2 and connected to the ground 40, it is possible to appropriately obtain the shielding effect and the effect of preventing static electricity from entering the electronic circuit board 4.

In the servo motor device 1 of the present embodiment, the ground line 40 is formed in a substantially circumferentially wound shape on the electronic circuit board 4 (see FIGS. 1 to 5).

For example, the ground line 40 may be formed to continuously extend or partially extend in a circumferential direction on a peripheral edge portion of the electronic circuit board 4. However, the ground line 40 is mostly formed in a substantially circumferentially wound shape.

Accordingly, the effect of preventing static electricity from entering the electronic circuit board 4 by the conductor portion 17 of the case body 2 can be further improved by preventing the inflow of the static electricity by the ground line 40.

In the present embodiment, the servo motor device 1 is adopted as an example of the electronic component of the present disclosure. As an example of the servo motor device 1, a servo motor for UAV is adopted.

The technical idea of the present disclosure can be suitably applied to the servo motor device 1 having the built-in electronic circuit board 4.

Further, in the present embodiment, the example in which the conductor portion 17 is formed at the first housing 10 of the case body 2 has been described. However, the conductor portion 17 may be formed at the second housing 20 or may be formed at both of the first housing 10 and the second housing 20. For example, the front end surface of the second fitting protrusion 22 of the second housing 20 may be formed as the conductor portion 17.

The presently disclosed effects are exemplary and are not restrictive. For example, other effects may be obtained, or a part of the effects described in the present disclosure may be obtained.

Further, the embodiments described in the present disclosure are merely examples, and the present disclosure is not limited to the above-described embodiments. Therefore, various changes can be made other than the above-described embodiments depending on the design and the like without departing from the technical idea of the present invention. Further, all combinations of the configurations described in the embodiments are not essential for solving the problem.

The invention claimed is:

1. An electronic component comprising:
a case body that is formed by fitting a first housing and a second housing;
an electronic circuit board that is accommodated in the case body; and
a conductor portion that is formed to continuously extend in a circumferential direction of the electronic circuit board at a portion of the first housing where the first housing is fitted to the second housing,
wherein the conductor portion is electrically connected to a ground of the electronic circuit board,
each of the first housing and the second housing is made of a conductive material on a surface of which an insulating film is formed,
the conductive material is electrically connected to the ground, and
the conductor material of the conductor portion of the first housing is exposed.

2. The electronic component of claim 1, wherein a ground line is formed in a substantially circumferentially wound shape on the electronic circuit board.

3. The electronic component of claim 1, wherein the electronic component is a servo motor device.

4. The electronic component of claim 2, wherein the electronic component is a servo motor device.

* * * * *